United States Patent
Carlough et al.

(10) Patent No.: US 8,286,061 B2
(45) Date of Patent: Oct. 9, 2012

(54) ERROR DETECTION USING PARITY COMPENSATION IN BINARY CODED DECIMAL AND DENSELY PACKED DECIMAL CONVERSIONS

(75) Inventors: Steven R. Carlough, Poughkeepsie, NY (US); Mark A. Erle, Macungie, PA (US); Michael R. Kelly, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 717 days.

(21) Appl. No.: 12/472,519

(22) Filed: May 27, 2009

(65) Prior Publication Data

US 2010/0306632 A1    Dec. 2, 2010

(51) Int. Cl.
*H03M 13/00* (2006.01)

(52) U.S. Cl. .......... 714/781; 714/758; 714/801
(58) Field of Classification Search .......... 714/758, 714/781, 801
See application file for complete search history.

(56) References Cited

U.S. PATENT DOCUMENTS

| | | | | |
|---|---|---|---|---|
| 4,314,350 A | * | 2/1982 | Toy | 708/533 |
| 4,716,566 A | * | 12/1987 | Masuhara et al. | 714/758 |
| 4,761,783 A | * | 8/1988 | Christensen et al. | 714/763 |
| 4,789,852 A | * | 12/1988 | Bailey et al. | 341/50 |
| 5,206,866 A | * | 4/1993 | Tanagawa | 714/763 |
| 5,673,419 A | * | 9/1997 | Nisar | 703/28 |
| 7,278,085 B1 | * | 10/2007 | Weng et al. | 714/766 |
| 2005/0246507 A1 | | 11/2005 | Busaba et al. | |
| 2006/0179098 A1 | | 8/2006 | Kelly et al. | |
| 2007/0061388 A1 | | 3/2007 | Carlough et al. | |

FOREIGN PATENT DOCUMENTS

| | | |
|---|---|---|
| JP | 56126347 | 10/1981 |
| JP | 9282810 | 10/1997 |

* cited by examiner

*Primary Examiner* — Esaw Abraham
(74) *Attorney, Agent, or Firm* — Cantor Colburn LLP; John Campbell

(57) ABSTRACT

Error detection using parity compensation in binary coded decimal (BCD) and densely packed decimal (DPD) conversions, including a computer program product having a tangible storage medium readable by a processing circuit and storing instructions for execution by the processing circuit for performing a method. The method includes receiving formatted decimal data in a first format, the formatted decimal data consisting of a DPD format data or a BCD format data. One or more first parity bits are generated by converting the received data into a second format of the formatted decimal data, and by determining the parity of the data in the second format. One or more second parity bits are generated directly from the received data. An error flag is set to indicate an error in the data in the second format in response to the first parity bits not being equal to the second parity bits.

20 Claims, 15 Drawing Sheets

ERROR DETECTION USING PARITY COMPENSATION IN BINARY CODED DECIMAL AND DENSELY PACKED DECIMAL CONVERSIONS

BACKGROUND

This invention relates generally to processing within a computing environment, and more particularly to error detection in a computing environment.

A commonly used base ten numeric representation is a packed decimal format referred to as binary coded decimal (BCD). In BCD format, a number is represented in a series of eight-bit bytes, where four bits of every byte are allocated to a single decimal digit, allowing each byte to represent two decimal digits.

Another base ten numeric representation is a densely packed decimal (DPD) format. In DPD format, three decimal digits are represented in ten bits.

Some contemporary processors execute decimal floating point operations on decimal floating point numbers that have a sign bit, a combination field, an exponent continuation field, and a coefficient continuation field. The coefficient continuation field may be compressed using a DPD encoding format where three decimal digits that normally take up twelve bits in a BCD encoding format are compacted into ten bits. However, the DPD encoded data must be converted into BCD encoded data before carrying out computations on the processor.

Thus, there is often a requirement to convert from BCD to DPD (may be referred to as BCD to DPD compression) and to convert from DPD to BCD (may be referred to as DPD to BCD expansion). At least two types of error checking may be part of the conversion process. Error checking may be performed on the input data (e.g., via a parity bit send with the input data) to verify that the expected data was received at the converter. In addition, error checking may be performed on the results of the conversion to verify the results of the conversion process.

BRIEF SUMMARY

An exemplary embodiment is a computer program product for performing error detection. The computer program product includes a tangible storage medium readable by a processing circuit and storing instructions for execution by the processing circuit for performing a method. The method includes receiving formatted decimal data in a first format, the formatted decimal data consisting of any one of a densely packed decimal (DPD) format data or a binary coded decimal (BCD) format data. One or more first parity bits are generated by converting the received data into a second format of the formatted decimal data, and by determining the parity of the data in the second format, where the second format is a format other than the first format. The method also includes generating one or more second parity bits directly from the received data in the first format. The first parity bits are compared to the second parity bits, and an error flag is set to indicate an error in the data in the second format in response to the first parity bits not being equal to the second parity bits.

Another embodiment is a system for performing error detection. The system includes a converter receiving formatted decimal data in a first format, and converting the received data into a second format. The formatted decimal data consists of any one of a DPD format data or a BCD format data, and the second format is a format other than the first format. The system also includes a parity generator connected to the converter, the parity generator receiving the data in the second format, and generating one or more first parity bits by determining the parity of the data in the second format. The system further includes a parity bit mechanism receiving the data in the first format and generating one or more second parity bits directly from the data in the first format. The system further includes a comparator connected to the parity bit generator and the parity bit mechanism. The comparator compares the first parity bits and the second parity bits, and sets an error flag to indicate an error in the data in the second format in response to the first parity bits not being equal to the second parity bits.

A further exemplary embodiment is a method for performing error detection. The method includes receiving formatted decimal data in a first format, the formatted decimal data consisting of any one of a DPD format data or a BCD format data. One or more first parity bits are generated by converting the received data into a second format of the formatted decimal data, and by determining the parity of the data in the second format, where the second format is a format other than the first format. The method also includes generating one or more second parity bits directly from the received data in the first format. The first parity bits are compared to the second parity bits, and an error flag is set to indicate an error in the data in the second format in response to the first parity bits not being equal to the second parity bits.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

An exemplary embodiment of the present invention reduces the area and power needed to provide error detection for densely packed decimal (DPD) to binary coded decimal (BCD) expansion. An exemplary embodiment also reduces the area and power needed to provide error detection for BCD to DPD compression.

Figure 1:
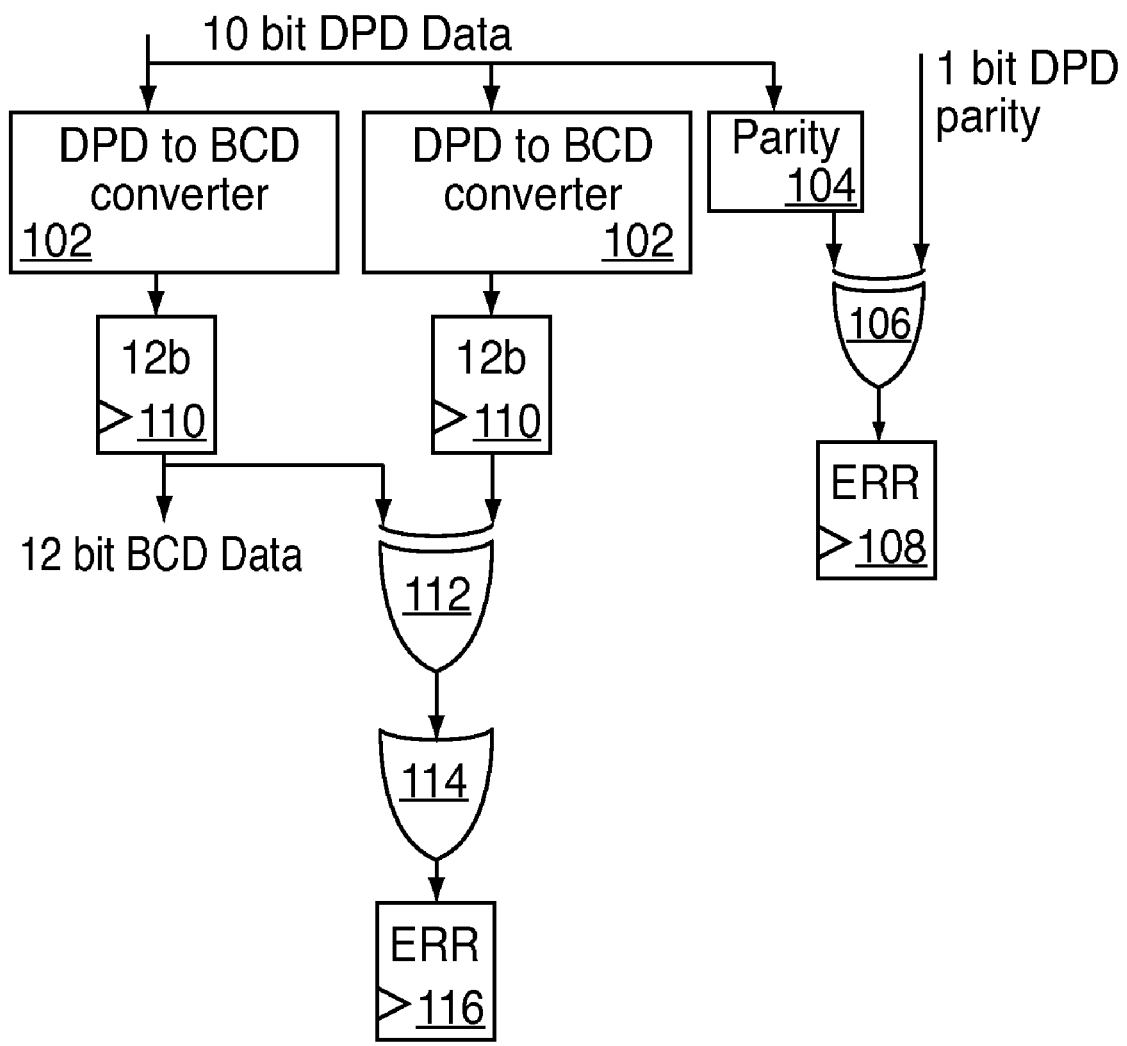
FIG. 1 depicts a system for performing error detection when converting from DPD data to BCD data using a duplicate converter and input parity.

FIG. 1 depicts a system for performing error detection when converting from DPD data to BCD data using a duplicate converter and input parity. There are two inputs to the system, DPD data (in this example ten bits of DPD data) and a parity bit that are received from a conversion requestor. Two types of error detection are depicted in FIG. 1, error detection on the input DPD data to verify that the DPD data was transmitted without error and error detection on the data conversion.

The received DPD data is input to a parity generator 104 for calculating the parity of the received DPD data. The parity calculated by the parity generator 104 is compared to the received parity bit using a two input exclusive-or (XOR) gate 106. The output of the comparison is stored in an error register 108 (e.g., an error bit is set to one to indicate an error and reset to zero to indicate no error).

The system depicted in FIG. 1 also includes two DPD to BCD converters 102 both receiving the DPD data. The DPD to BCD converters 102 convert the DPD data into BCD data (in this example twelve bits of BCD data) and output the BCD data to twelve bit registers 110. The contents of the registers 110 are compared via twelve two input XOR gates 112, with the results of the comparison being input to a twelve input OR gate 114. The results of this comparison are input to one bit error register 116. In this manner, error detection is performed on the DPD to BCD expansion.

As depicted in FIG. 1, to perform the error detection, the two converters 102 must operate in parallel and the output must be latched into the registers 110 for timing purposes. Next, the latched output of the parallel converters is compared via the twelve two input XOR gates 112 and one twelve input OR gate 114 to verify that an error did not take place and an error status is reported to an error collection latch, or error register 116. The additional latches, or registers, and the extra DPD to BCD converter 102 create a significant hardware area overhead associated with the error detection (about twice as much area is required to perform error detection). Given the aggressive cycle times of modern processors (e.g., microprocessors), the parity checking, conversion, and comparison may not be possible in a single cycle, thus requiring staging latches that further increase area and power budgets.

Figure 2:
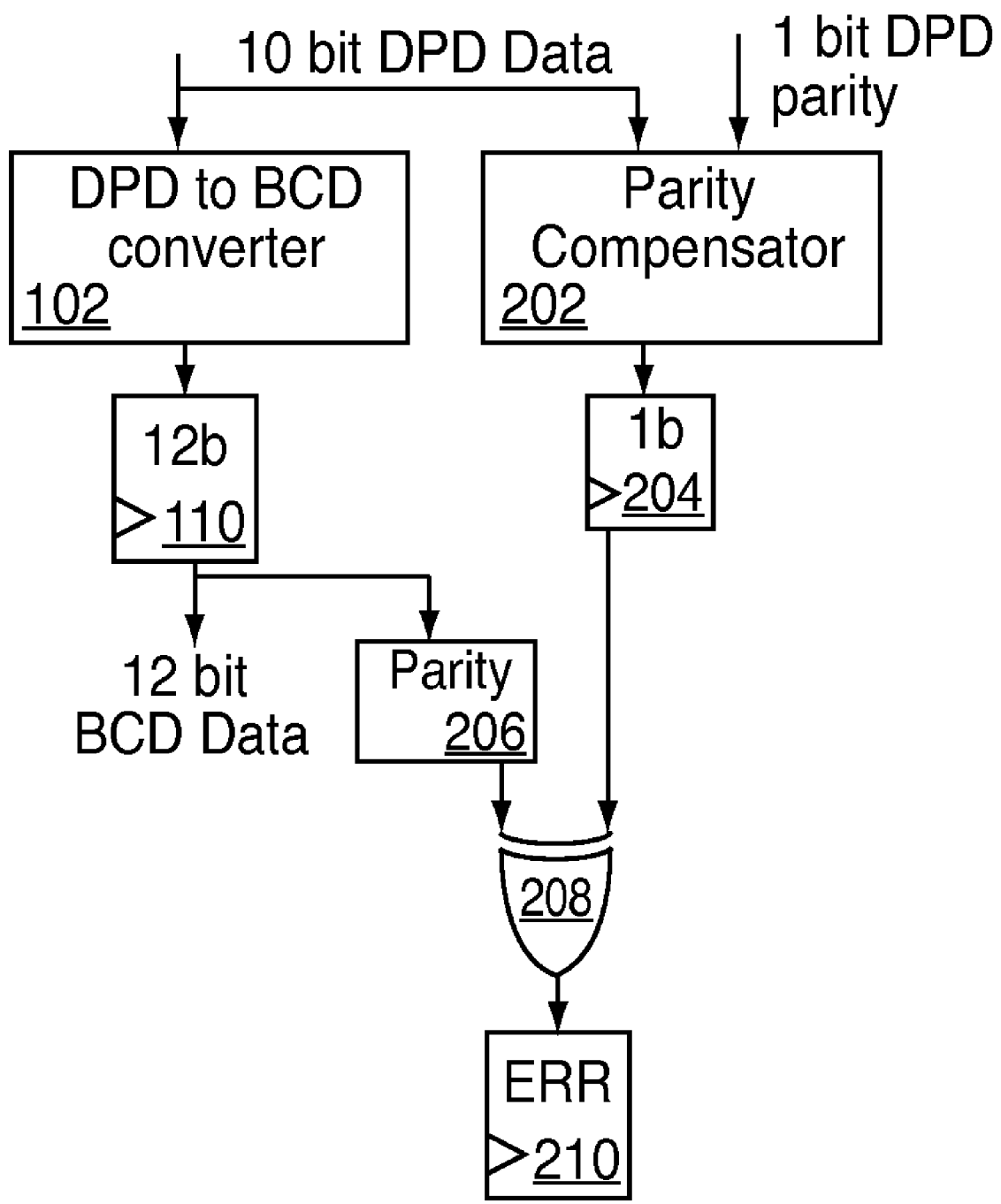
FIG. 2 depicts a system for performing error detection when converting from DPD data to BCD data using a parity compensator and input parity that may be implemented by an exemplary embodiment.

FIG. 2 depicts a system for performing error detection when converting from DPD data to BCD data using a parity compensator and input parity that may be implemented by an exemplary embodiment. The system depicted in FIG. 2 performs error detection using circuitry that requires less area than that required by the system depicted in FIG. 1. The embodiment depicted in FIG. 2 includes two inputs: DPD data (in this example ten bits of DPD data) and a DPD parity bit. In an exemplary embodiment the inputs are received from a conversion requester via a receiver or from storage (e.g., a register).

As depicted in FIG. 2, the received DPD data is input to a DPD to BCD converter 102. The DPD to BCD converter 102 performs the DPD to BCD conversion and latches the results into a register 110. The BCD data (in this example, twelve bits of BCD data) is output from the system (e.g., via a transmitter to a requester of the conversion, or stored in storage accessible by the requester such as a register). The BCD data is also output to a parity generator 206 that determines the parity of the BCD data and outputs a parity bit (also referred to herein as a first BCD parity bit) to a two input XOR gate 208.

Figure 3:
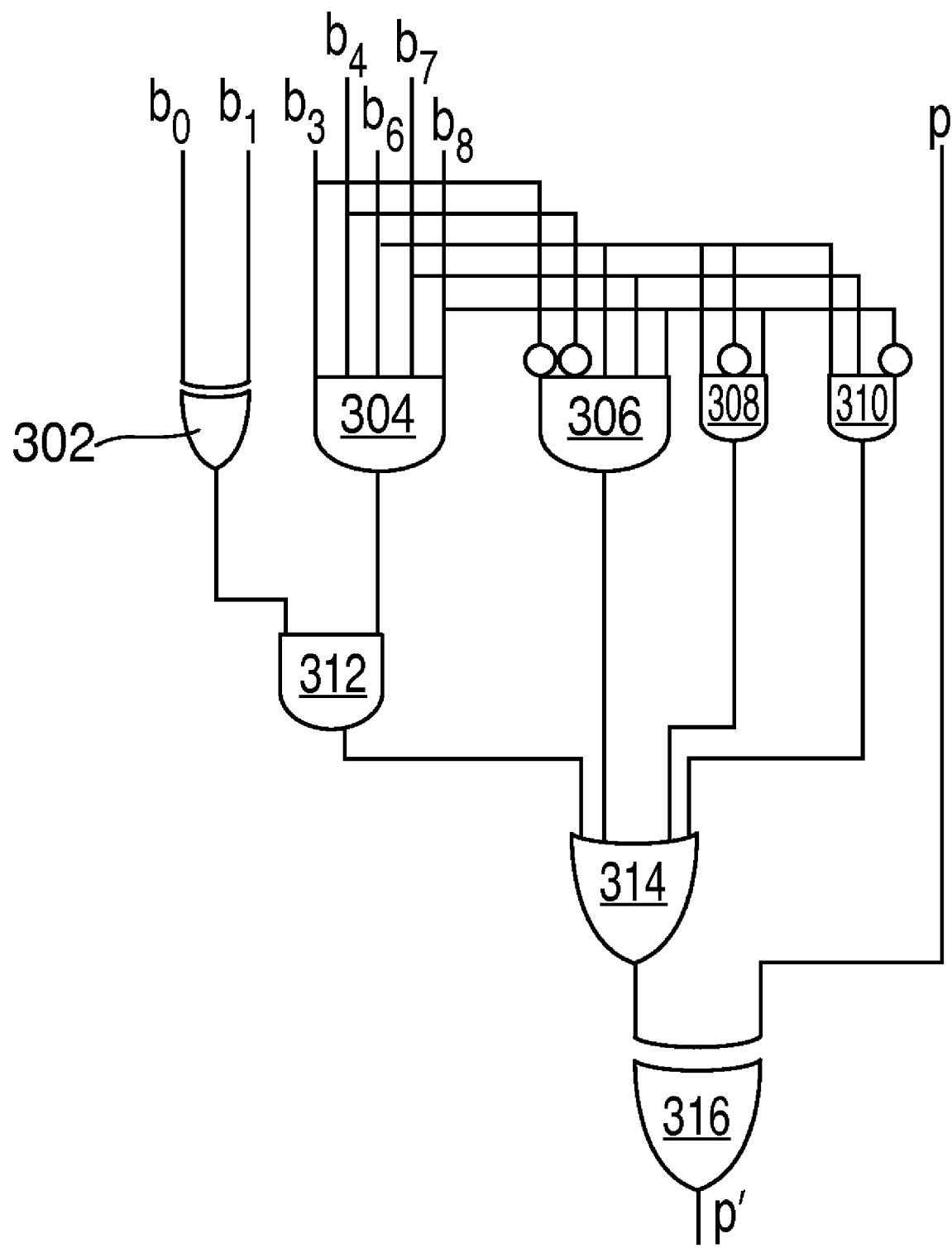
FIG. 3 depicts a BCD parity compensator that may be implemented by an exemplary embodiment.

The received DPD data and the received DPD parity bit are also input to a BCD parity compensator 202. The BCD parity compensator 202 generates a BCD parity bit (also referred to herein as a second BCD parity bit) directly from the received DPD data and the received DPD parity bit. FIG. 3 below depicts a BCD parity compensator 202 that may be implemented by an exemplary embodiment to modify the received DPD parity bit based on the received DPD data such that in the absence of an error, it will match the generated parity bit of the BCD data.

Referring to FIG. 2, the second BCD parity bit is output from the BCD parity compensator 202 and stored in a latch such as a one bit register 204. The second BCD parity bit is input to a two input XOR gate 208 along with the first BCD parity bit to determine if they match. Output from the XOR gate 208 is stored in a latch, such as a one bit error register 210. Contents of the latch are referred to herein as an error flag. In an exemplary embodiment, if the parity bits don't match, the error flag is set (e.g., a value of one is written to the error register 210) and if the parity bits match, the error flag is reset (e.g., a value on zero is written to the error register 210). In another exemplary embodiment, the error flag is initialized to the value zero (e.g., is reset) and the error flag is set when the first BCD parity bit does not match the second BCD parity bit.

In an exemplary embodiment, the error flag is output from the system (e.g., via a transmitter to a requestor of the conversion, or stored in storage accessible by the requester such as a register) along with the BCD data. In an alternate exemplary embodiment, the first BCD parity bit is also output from the system along with the BCD data. In a further exemplary embodiment, the error flag is output from the system only when the error flag is set (indicating that an error had been detected in the BCD data).

As depicted in FIG. 2, the BCD parity compensator 202 and one bit latch or register 204 is all that is needed to generate and store the compensated parity bit (the second BCD parity bit). Although, embodiments of the BCD parity compensator 202 are only moderately smaller than the second DPD to BCD converter 102, the area and power saving from the removal of eleven latches (i.e., by replacing a twelve bit register 110 with a one bit register 204) is significant. Also, the twelve two input XOR gates 112, twelve input OR gate 114 and separate error latch (e.g., register 116) are not needed when parity compensation is implemented as depicted in FIG. 2. The parity generator 206 has been moved to the twelve bit BCD data output such that the twelve input XOR gates 112 followed by a twelve input OR gate 114 required by the system in FIG. 1 is reduced to a two input XOR gate 208. Total area savings using the embodiment depicted in FIG. 2 (and the BCD parity compensator depicted in FIG. 3) instead of the embodiment depicted in FIG. 1 is approximately twenty nine percent.

FIG. 3 depicts a BCD parity compensator, such as BCD parity compensator 202, that may be implemented by an exemplary embodiment. The received DPD data (ten bits denoted as bits zero through nine) and the DPD parity bit are input to the parity compensator. In an alternate exemplary embodiment, bits zero, one, three, four, six, seven and eight are input to the parity compensator. Bits zero and one of the DPD data are input to a two input XOR gate 302. Bits three and four and six through eight are input to a five input AND gate 304. The complement of bits three and four, along with bits six through eight are input to another five input AND gate 306. Bit six, the complement of bit seven, and bit eight are input to a three input AND gate 308. Bit six, bit seven, and the complement of bit eight are input to another three input AND gate 310. The output of the XOR gate 302 and the output of AND gate 304 are input to a two input AND gate 312. The output of AND gate 312, AND gate 306, AND gate 308, and AND gate 310 are input to a four input OR gate 314. The output of the OR gate 314 and the received DPD parity bit are input to a two input XOR gate 316. The output from the XOR gate 316 is the compensated DPD parity bit (also referred to herein as the second BCD parity bit) that has been compensated, or adjusted, to be the parity bit associated with BCD data having the same value as the received DPD data.

Figure 4:
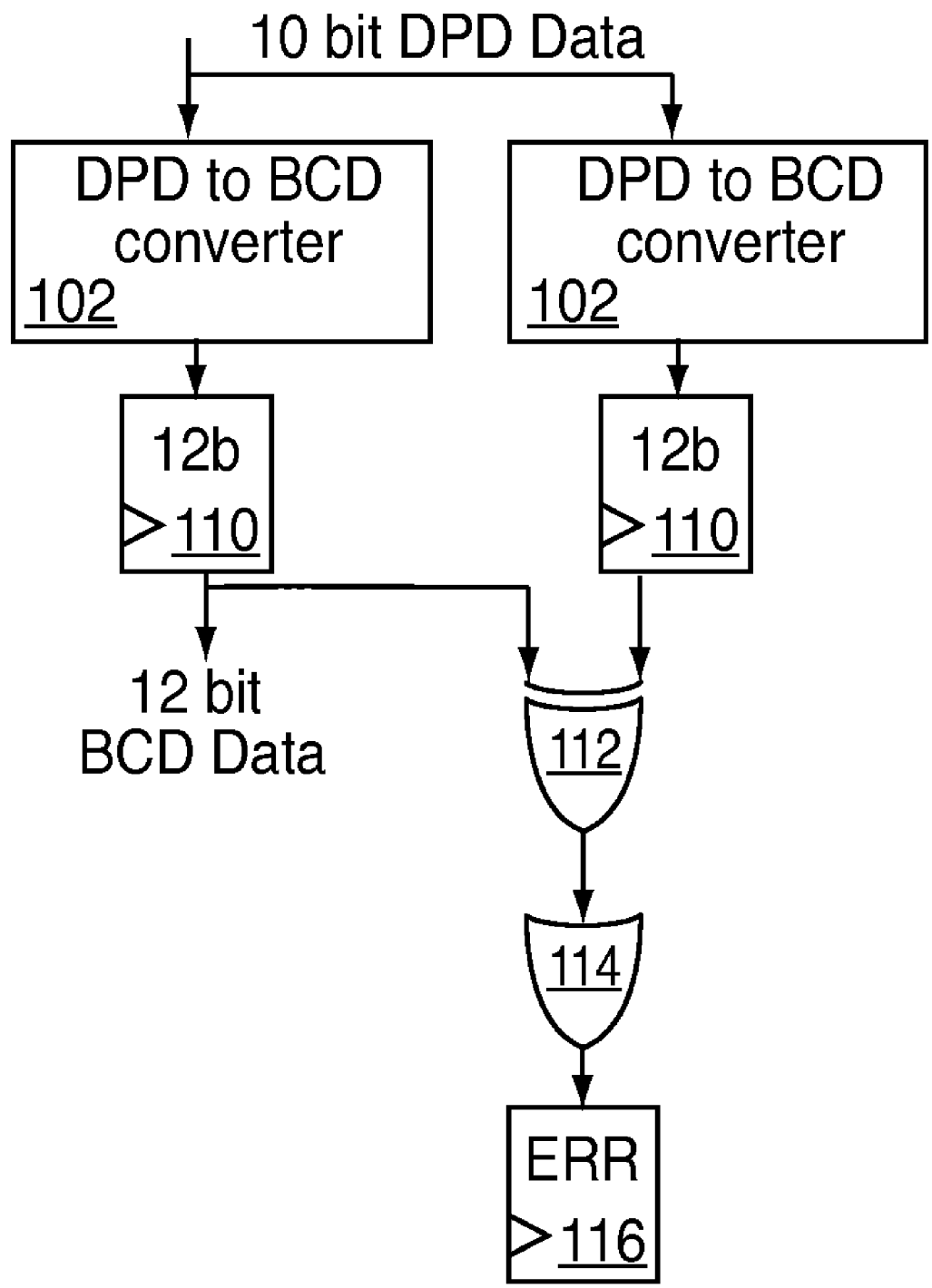
FIG. 4 depicts a system for performing error detection when converting from DPD data to BCD data using a duplicate converter.

FIG. 4 depicts a system for performing error detection when converting from DPD data to BCD data using a duplicate converter. There is one input to the system, DPD data (in this example ten bits of DPD data) that is received from a conversion requestor. The system depicted in FIG. 4 includes two DPD to BCD converters 102 both receiving the DPD data. The DPD to BCD converters 102 convert the DPD data into BCD data (in this example twelve bits of BCD data) and output the BCD data to twelve bit registers 110. The contents of the registers 110 are compared in parallel via twelve two input XOR gates 112, with the results of the comparison being input to a twelve input OR gate 114. The results of this OR gate 114 are input to one bit error register 116. In this manner, error detection is performed on the DPD to BCD expansion.

As depicted in FIG. 4, to perform the error detection, the two converters 102 must operate in parallel and the output must be latched into the registers 110 for timing purposes. Next, the latched output of the parallel converters is compared via the twelve two input XOR gates 112 and twelve input OR gate 114 to verify that an error did not take place and an error status is reported to an error collection latch, or error register 116. The additional latches, or registers, and the extra DPD to BCD converter 102 create a significant hardware area overhead associated with the error detection (about twice as much area is required to perform error detection). Given the aggressive cycle times of modern processors (e.g., microprocessors), the parity checking, conversion, and comparison may not be possible in a single cycle, thus requiring staging latches that further increase area and power budgets.

Figure 5:
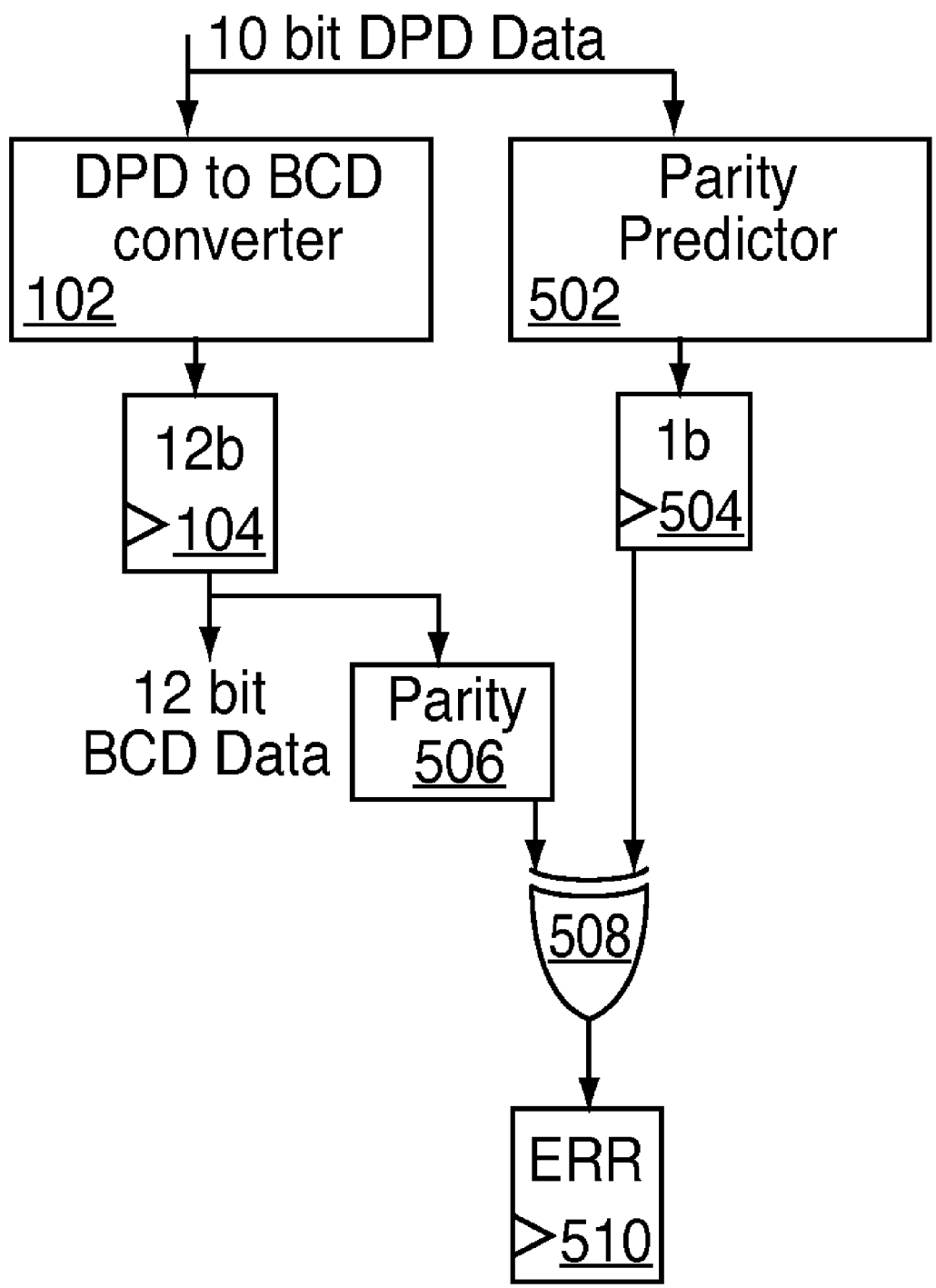
FIG. 5 depicts a system for performing error detection when converting from DPD data to BCD data using a parity predictor that may be implemented by an exemplary embodiment.

FIG. 5 depicts a system for performing error detection when converting from DPD data to BCD data using a BCD parity predictor that may be implemented by an exemplary embodiment. The system depicted in FIG. 5 performs error detection using circuitry that requires less area than that required by the system depicted in FIG. 4. The embodiment depicted in FIG. 5 includes one input: DPD data (in this example ten bits of DPD data) received from a conversion requester via a receiver or from storage (e.g., a register).

As depicted in FIG. 5, the received DPD data is input to a DPD to BCD converter 102. The DPD to BCD converter 102 performs the DPD to BCD expansion and latches the results into a register 110. The BCD data (in this example, twelve bits of BCD data) is output from the system (e.g., via a transmitter to a requester of the conversion, or stored in storage accessible by the requester such as a register). The BCD data is also output to a parity generator 506 that determines the parity of the BCD data and outputs a parity bit (also referred to herein as a first BCD parity bit) to a two input XOR gate 508.

Figure 6:
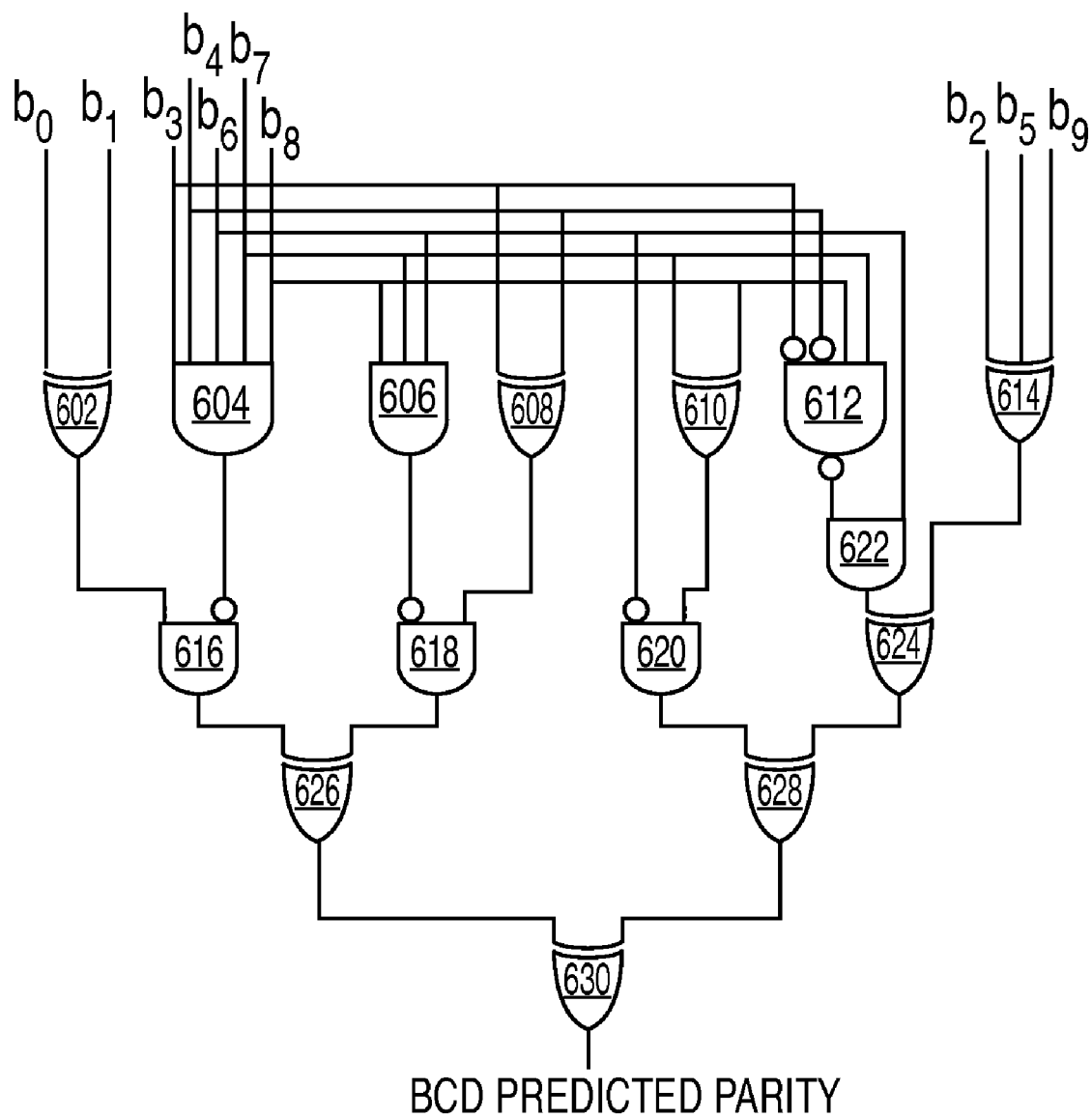
FIG. 6 depicts a DPD to BCD parity predictor that may be implemented by an exemplary embodiment.

The received DPD data and the received DPD parity bit are also input to a BCD parity predictor 502. The BCD parity predictor 502 generates a BCD parity bit (also referred to herein as a second BCD parity bit) based on the received DPD data. FIG. 6 below depicts a BCD parity predictor 502 that may be implemented by an exemplary embodiment.

Referring to FIG. 5 the second BCD parity bit is output from the BCD parity predictor 502 and stored in a latch such as a one bit register 504. The second BCD parity bit is input to the two input XOR gate 508 along with the first BCD parity bit to determine if they match. Output from the XOR gate 508 is stored in a latch, such as a one bit error register 510. Contents of the latch are referred to herein as an error flag. In an exemplary embodiment, if the parity bits don't match, the error flag is set (e.g., a value of one is written to the error register 510) and if the parity bits match, the error flag is reset (e.g., a value on zero is written to the error register 510). In another exemplary embodiment, the error flag is initialized to the value zero (e.g., is reset) and the error flag is set when the first BCD parity bit does not match the second BCD parity bit.

The error flag is output from the system (e.g., via a transmitter to a requester of the conversion, or stored in storage accessible by the requester such as a register) along with the BCD data. In an alternate exemplary embodiment, the first BCD parity bit is also output from the system along with the BCD data. In a further exemplary embodiment, the error flag is output from the system only when the error flag is set (indicating that an error was been detected in the BCD data).

FIG. 6 depicts a BCD parity predictor, such as parity predictor 502, that may be implemented by an exemplary embodiment. Inputs b0 and b1 are connected to a two input XOR gate 602. Inputs b3, b4, b6, b7, b8 are connected to a five input AND gate 604. The output of XOR gate 602 and the compliment of the output of AND gate 604 are connected to a 2 input AND gate 616. Inputs b6, b7 and b8 are also connected to a three input AND gate 606. Inputs b3 and b4 are also connected to a two input XOR gate 608. The compliment of the output of AND gate 606 and the output on XOR gate 608 are connected to a two input AND gate 618. Inputs b7 and b8 are also connected to a two input XOR gate 610. The output of XOR gate 610 and the compliment of input b6 are connected to two input AND gate 620. The compliment of Inputs b3 and b4 and inputs b7 and b8 are connected to four input AND gate 612. The compliment of AND gate 612 and input b6 are connected to two input AND gate 622. Inputs b2, b5, and b9 are connected to three input XOR gate 614. The output of XOR gate 614 and AND gate 622 are connected to a two input XOR gate 624. The output of AND gate 616 and AND gate 618 are connected to two input XOR gate 626. The output of AND gate 620 and XOR gate 624 are connected to a two input XOR gate 628. The output of XOR gate 626 and XOR gate 628 are connected to a two input XOR gate 630. The parity predictor depicted in FIG. 6, is an exemplary embodiment, and one familiar in the art could implement the same function with a different combination of logic gates.

The circuit described in FIG. 6 effectively computes the function:

p'=((b0 xor b1) and not (b6 and b7 and b8 and b3 and b4)) XOR ((b3 xor b4) and not (b6 and b7 and b8)) XOR ((b7 xor b8) and not b6) XOR ((b2 xor b5 xor b10) XOR (b6 and (not b7 or not b8 or (b3 and b4)), where p' is referred to herein as second BCD parity bit.

Figure 7:
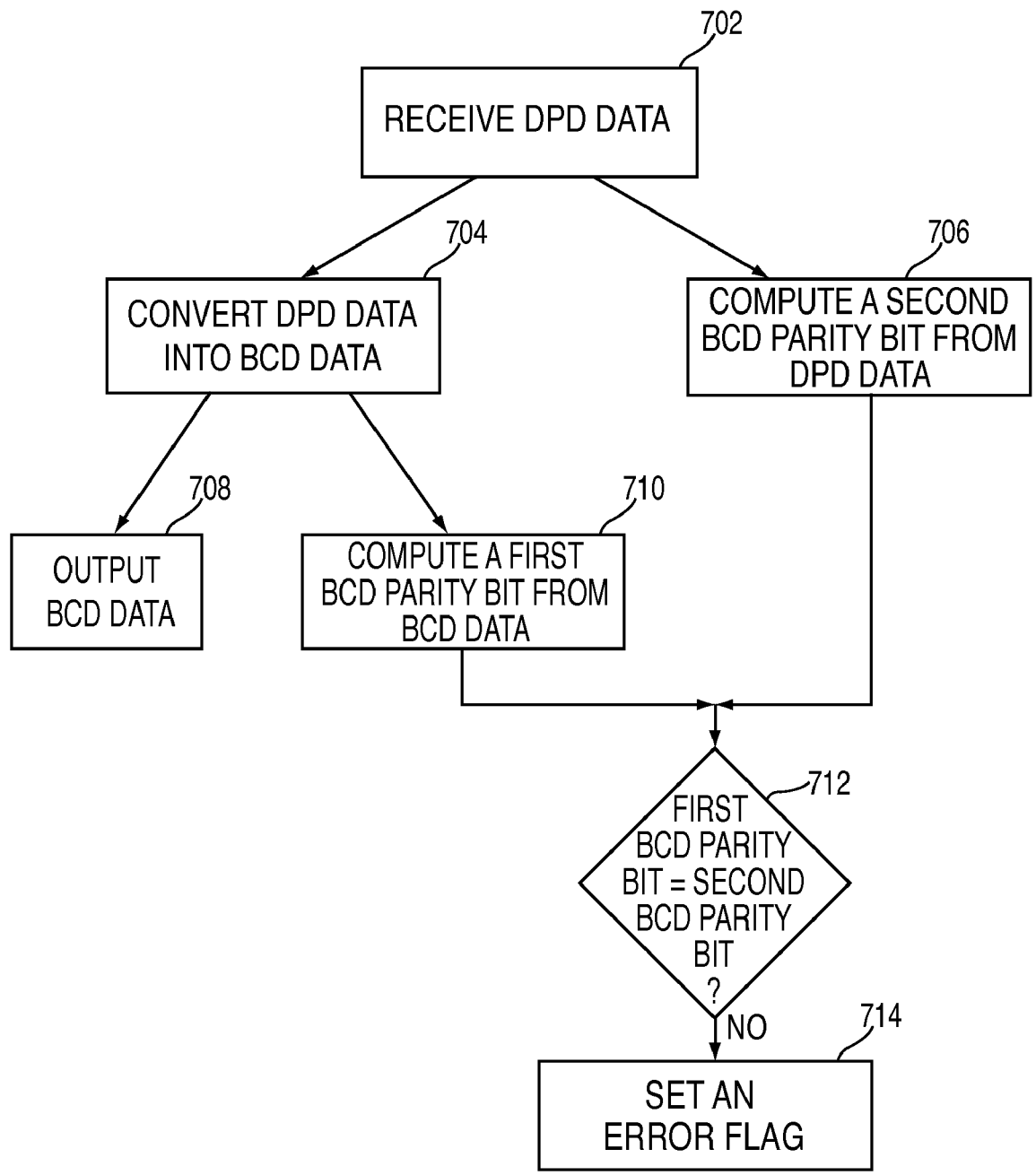
FIG. 7 depicts a process for performing error detection when converting from DPD data to BCD data that may be implemented by an exemplary embodiment.

FIG. 7 depicts a process for performing error detection when converting from DPD data to BCD data that may be implemented by an exemplary embodiment. The process depicted in FIG. 7 may be implemented by the systems depicted in FIGS. 2 and 5 described previously. At block 702, DPD data is received from a DPD to BCD expansion requestor. As described previously, with respect to FIG. 2, a parity bit may also be received by the system. Processing then continues at blocks 704 and 706. At block 704, the DPD data is converted into BCD data by a DPD to BCD converter 102. The converted BCD data is output to the requester and it is output to a parity generator, such as parity generator 206 or 506. At block 710, the parity generator computes a first BCD parity bit from the BCD data. Processing then continues at block 712.

At block 706, a second parity bit is computed by a parity bit mechanism based on the received DPD data. The parity bit mechanism may be implemented by a BCD parity predictor, such as BCD parity predictor 502, or if a DPD input parity bit is also received from the requester it may be implemented by a BCD parity compensator, such as BCD parity compensator 202. Processing then continues at block 712, where it is determined if the first BCD parity bit is equal to the second BCD parity bit (e.g., using XOR gate 208 or 508). If they are not equal, block 714 is performed and an error flag is set. In an exemplary embodiment, the error flag (e.g., located in register 210 or 510) is sent to the requester or other error collection logic along with the BCD data.

Figure 8:
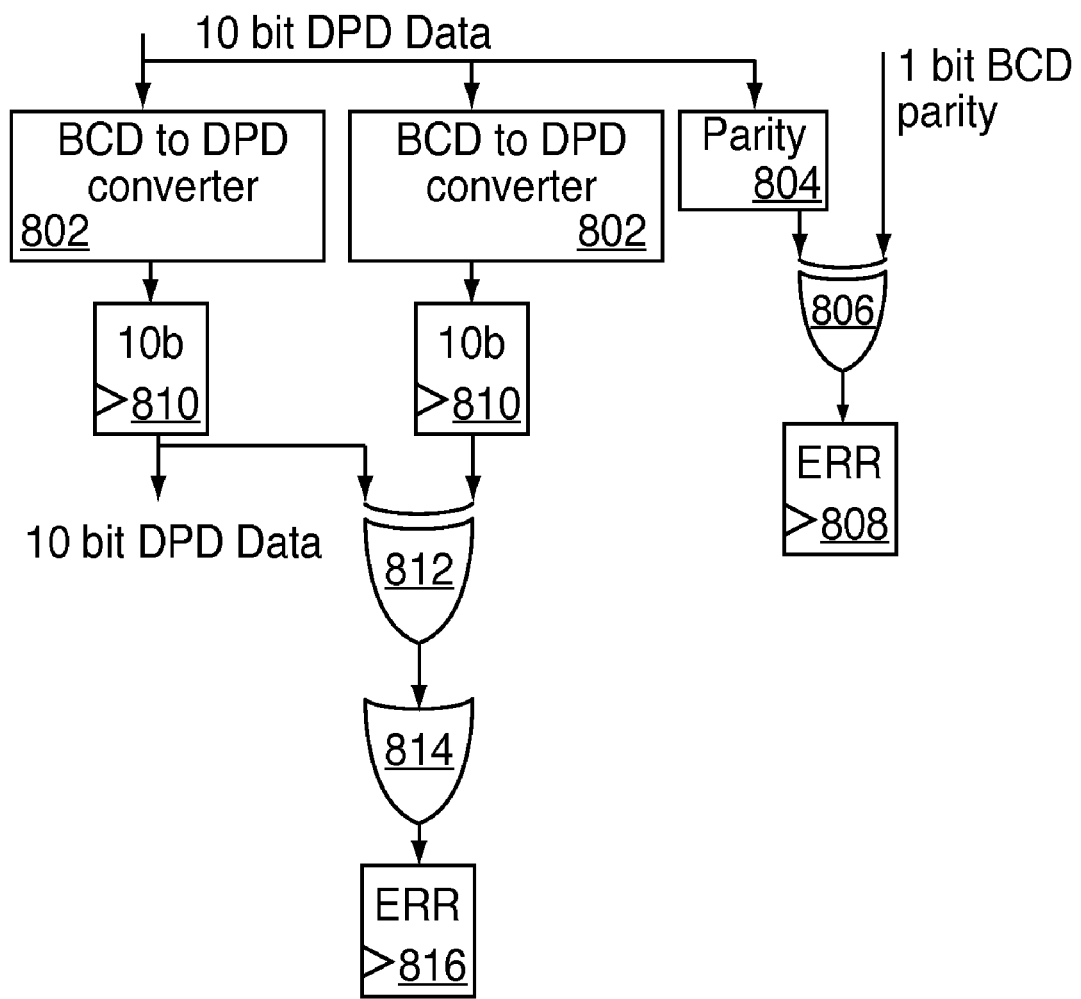
FIG. 8 depicts a system for performing error detection when converting from BCD data to DPD data using a duplicate converter and input parity.

FIG. 8 depicts a system for performing error detection when converting from BCD data to DPD data using a duplicate converter and input parity. There are two inputs to the system, BCD data (in this example twelve bits of BCD data) and a parity bit that are received from a conversion requestor. The received BCD data is input to a parity generator 804 for calculating the parity of the received BCD data. The parity calculated by the parity generator 804 is compared to the received parity bit using a one input XOR gate 806. The output of the comparison is stored in an error register 808.

The system depicted in FIG. 8 also includes two BCD to DPD converters 802 both receiving the BCD data. The BCD to DPD converters 802 convert the BCD data into DPD data (in this example ten bits of DPD data) and output the DPD data to ten bit registers 810. The contents of the registers 810 are compared via a ten parallel two input XOR gates 812, with the results of the comparison being input to a ten input OR gate 814. The results of this comparison are input to one bit error register 816. In this manner, error detection is performed on the BCD to DPD compression.

As depicted in FIG. 8, to perform the error detection, the two converters 802 must operate in parallel and the output must be latched into the registers 810 for timing purposes. Next, the latched output of the parallel converters is compared via the ten two input XOR gates 812 and the ten input OR gate 814 to verify that an error did not take place and an error status is reported to an error collection latch, or error register 816. The additional latches, or registers, and the extra BCD to DPD converter 802 create a significant hardware area overhead associated with the error detection (about twice as much area is required to perform error detection).

Figure 9:
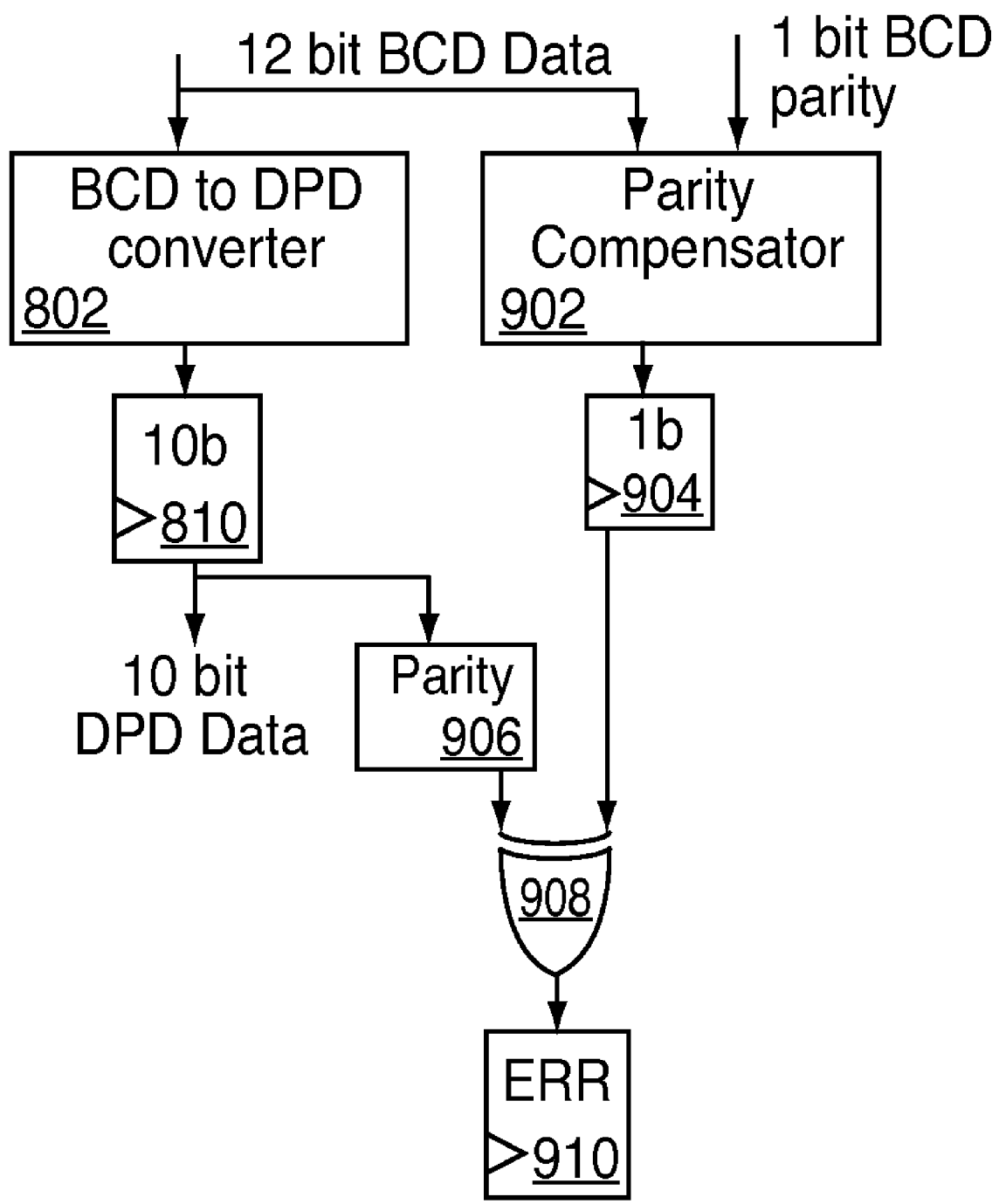
FIG. 9 depicts a system for performing error detection when converting from BCD data to DPD data using a parity compensator and input parity that may be implemented by an exemplary embodiment.

FIG. 9 depicts a system for performing error detection when converting from BCD data to DPD data using a parity compensator and input parity that may be implemented by an exemplary embodiment. The system depicted in FIG. 9 performs error detection using circuitry that requires less area than that required by the system depicted in FIG. 8. The embodiment depicted in FIG. 9 includes two inputs: BCD data (in this example twelve bits of BCD data) and a BCD parity bit. In an exemplary embodiment, the inputs are received from a conversion requester via a receiver or from storage (e.g., a register).

As depicted in FIG. 9, the received BCD data is input to a BCD to DPD converter 802. The BCD to DPD converter 802 performs the BCD to DPD conversion and latches the results into a register 810. The DPD data (in this example, ten bits of DPD data) is output from the system (e.g., via a transmitter to a requester of the conversion, or stored in storage accessible by the requester such as a register). The DPD data is also output to a parity generator 906 that determines the parity of the DPD data and outputs a parity bit (also referred to herein as a first DPD parity bit) to a two input XOR gate 908.

Figure 10:
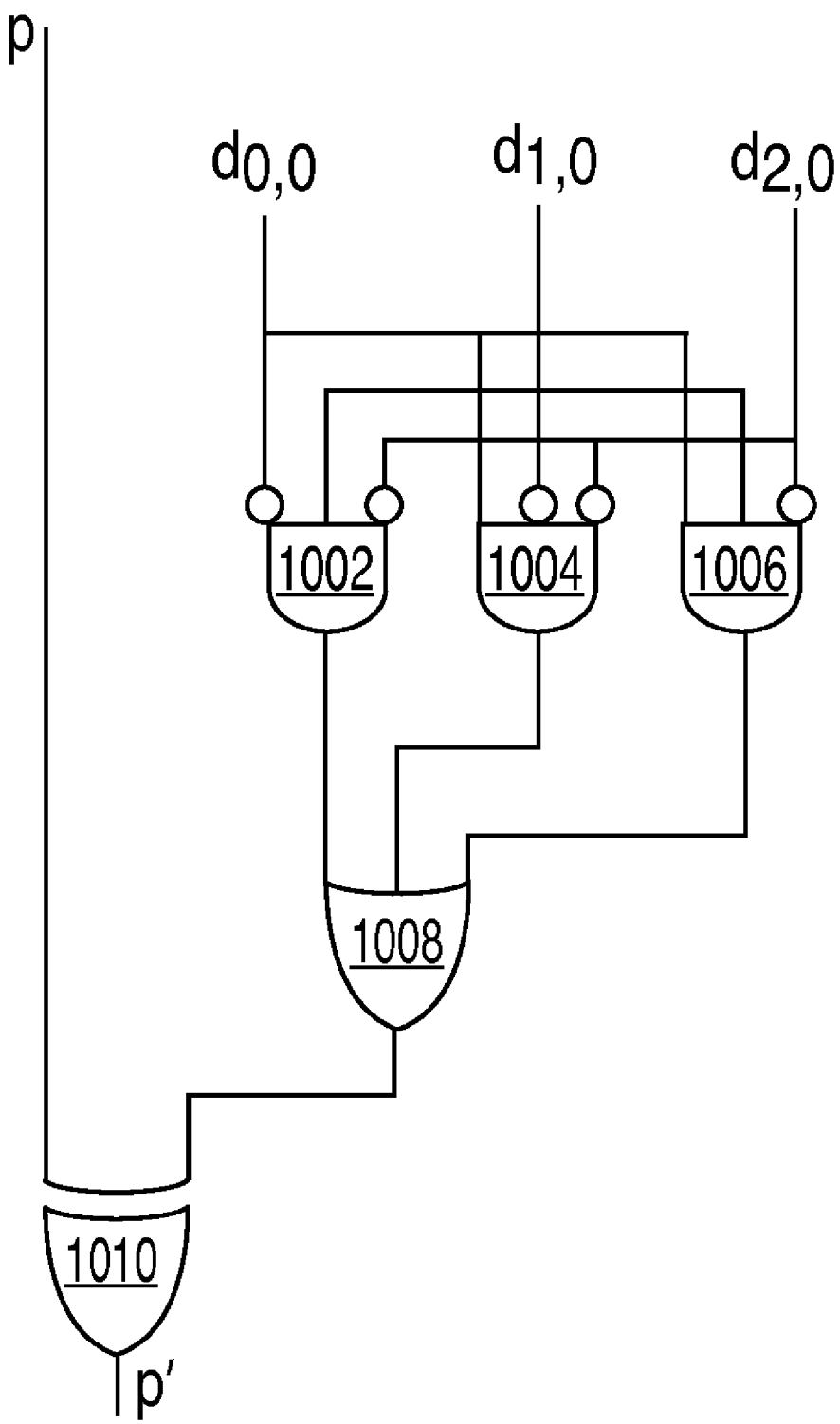
FIG. 10 depicts a BCD to DPD parity compensator that may be implemented by an exemplary embodiment.

The received BCD data and the received BCD parity bit are also input to a DPD parity compensator 902. The DPD parity compensator 902 generates a DPD parity bit (also referred to herein as a second DPD parity bit) based on the received BCD data and the received BCD parity bit. FIG. 10 below depicts a DPD parity compensator 902 that may be implemented by an exemplary embodiment.

Referring to FIG. 9, the second DPD parity bit is output from the DPD parity compensator 902 and stored in a latch such as a one bit register 904. The second DPD parity bit is input to a two input XOR gate 908 along with the first DPD parity bit to determine if they match. Output from the XOR gate 908 is stored in a latch, such as a one bit error register 910. Contents of the latch are referred to herein as an error flag. In an exemplary embodiment, if the parity bits don't match, the error flag is set (e.g., a value of one is written to the error register 910) and if the parity bits match, the error flag is reset (e.g., a value on zero is written to the error register 910). In another exemplary embodiment, the error flag is initialized to the value zero (e.g., is reset) and the error flag is set when the first DPD parity bit does not match the second DPD parity bit.

The error flag is output from the system (e.g., via a transmitter to a requester of the conversion, or stored in storage accessible by the requester such as a register) along with the DPD data. In an alternate exemplary embodiment, the first DPD parity bit is also output from the system along with the DPD data. In a further exemplary embodiment, the error flag is output from the system only when the error flag is set (indicating that an error was been detected in the DPD data).

As depicted in FIG. 9, the DPD parity compensator 902 and one bit latch or register 904 is all that is needed to generate and store the compensated parity bit (the second DPD parity bit). Although, embodiments of the DPD parity compensator 902 are only moderately smaller than the second BCD to DPD converter 802, the area and power saving from the removal of nine latches (i.e., by replacing a ten bit register 110 with a one bit register 904) is significant. Also, the ten two input XOR gates 812, ten input OR gate 814 and separate error latch (e.g., register 816) are not needed when parity compensation is implemented as depicted in FIG. 9. The parity generator 906 has been moved to the ten bit DPD data output such that the ten two input XOR gates 812 followed by a ten input OR gate 814 required by the system in FIG. 8 is reduced to a two input XOR gate 908. Total area savings using the embodiment depicted in FIG. 9 (and the DPD parity compensator depicted in FIG. 10) instead of the embodiment depicted in FIG. 8 is approximately thirty four percent.

FIG. 10 depicts a DPD parity compensator that may be implemented by an exemplary embodiment. Of the received BCD data (twelve bits denoted as d0,0:3 d1,0:3 and d2,0:3 refer to three four-bit BCD digits d0, d1, and d2, where the four bits of each digit is referred to as 0:3) the most significant bit of each digits denoted as d0,0, d1,0 and d2,0 are sent to the parity compensator. Each bit d0,0 (referred to as bit zero) d1,0 (referred to as bit one) and d2,0 (referred to as bit two) being the most significant bit of digits d0, d1, and d2 respectively, indicate that said digit contains the numeric value of "8 or 9" if it's a '1', and said digit contains the value "0 through 7" is it's a '0'. In an alternate exemplary embodiment, all twelve bits of bit BCD data are input to the parity compensator. As depicted in FIG. 10, the complement of bit zero, bit one and the complement of bit two are input to a three input AND gate 1002. Bit zero, the complement of bit one, and the complement of bit two are input to another three input AND gate 1004. Bit zero, bit one, and the complement of bit two are input to a third three input AND gate 1006. The output of AND gate 1002, AND gate 1004, and AND gate 1006 are input to a three input OR gate 1008. The output of the OR gate 1003 and the received BCD parity bit are input to a two input XOR gate 1010. The output from the XOR gate 1010 is the compensated BCD parity bit (also referred to herein as the second DPD parity bit) that has been compensated, or adjusted, to be the parity bit associated with DPD data having the same value as the received BCD data.

Figure 11:
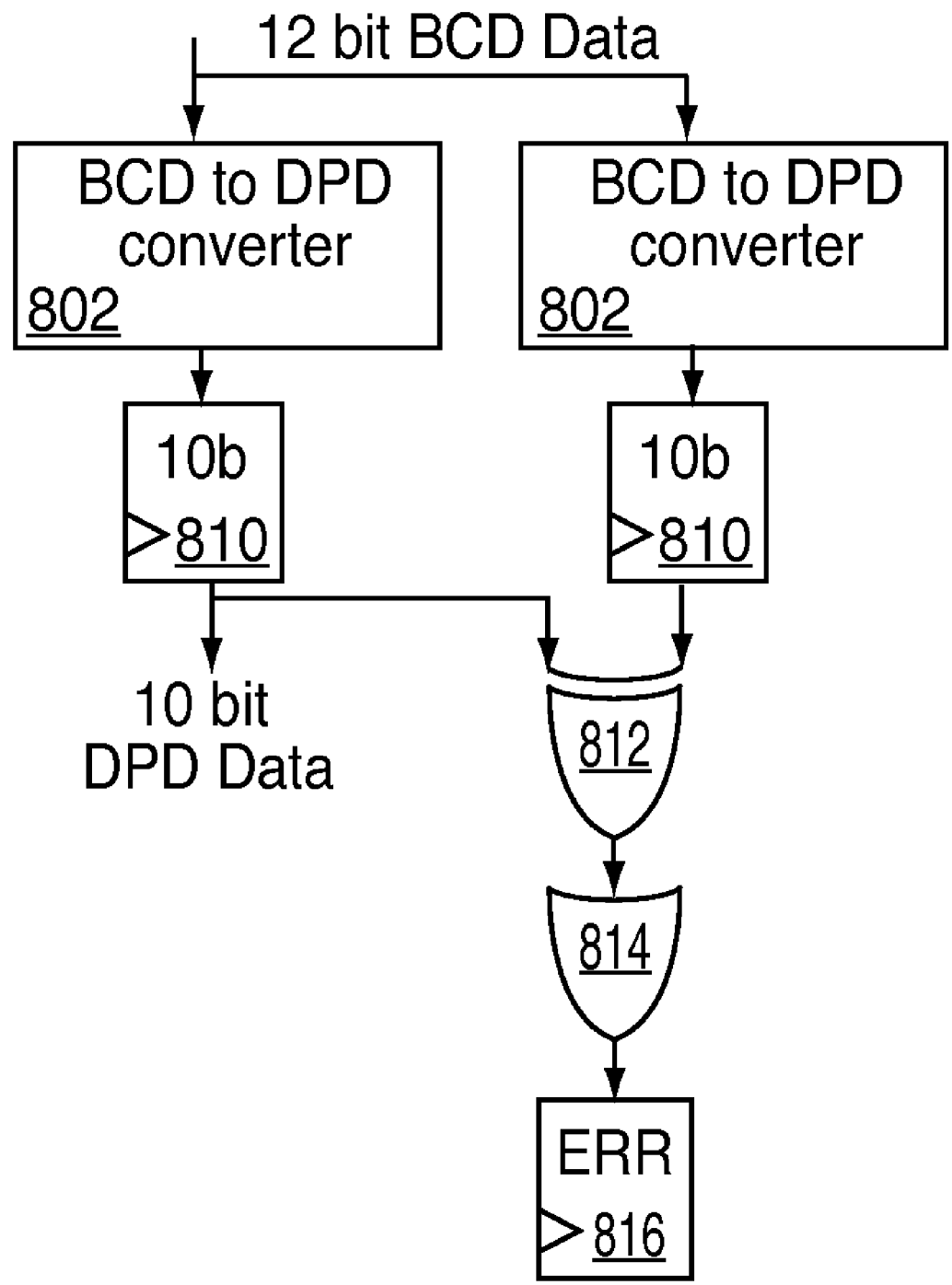
FIG. 11 depicts a system for performing error detection when converting from BCD data to DPD data using a duplicate converter.

FIG. 11 depicts a system for performing error detection when converting from BCD data to DPD data using a duplicate converter. There is one input to the system, BCD data (in this example twelve bits of BCD data) that is received from a conversion requestor. The system depicted in FIG. 11 includes two BCD to DPD converters 802 both receiving the BCD data. The BCD to DPD converters 802 convert the BCD data into DPD data (in this example ten bits of DPD data) and output the DPD data to ten bit registers 810. The contents of the registers 810 are compared via a ten two input XOR gates 812, with the results of the comparison being input to a ten input OR gate 814. The results of this comparison are input to one bit error register 816. In this manner, error detection is performed on the BCD to DPD compression.

Figure 12:
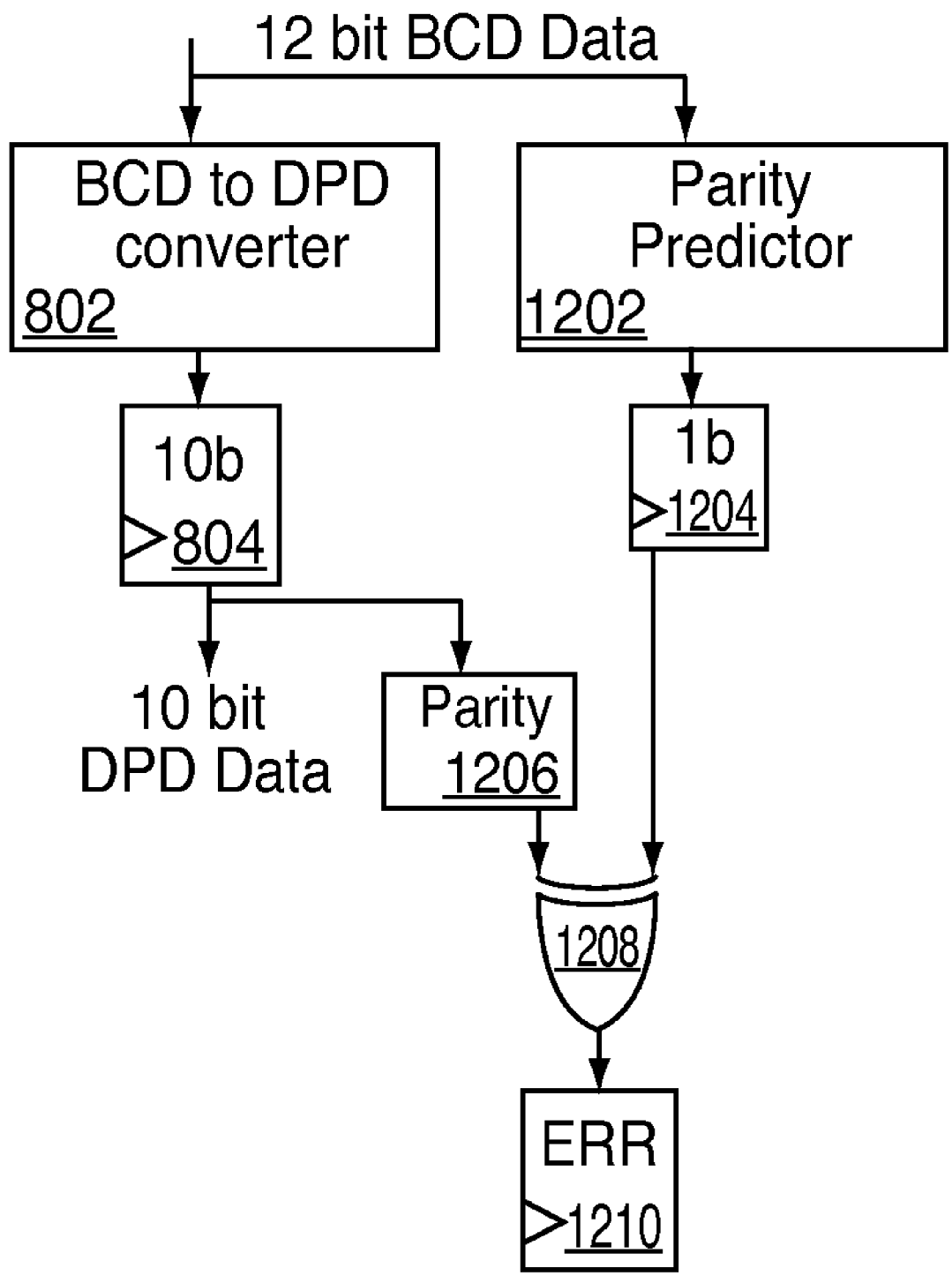
FIG. 12 depicts a system for performing error detection when converting from BCD data to DPD data using a parity predictor that may be implemented by an exemplary embodiment.

FIG. 12 depicts a system for performing error detection when converting from BCD data to DPD data using a parity predictor that may be implemented by an exemplary embodiment. The system depicted in FIG. 12 performs error detection using circuitry that requires less area than that required by the system depicted in FIG. 11. The embodiment depicted in FIG. 12 includes one input: BCD data (in this example twelve bits of BCD data) received from a conversion requestor via a receiver or from storage (e.g., a register).

As depicted in FIG. 12, the received BCD data is input to a BCD to DPD converter 802. The BCD to DPD converter 802 performs the BCD to DPD compression and latches the results into a register 810. The DPD data (in this example, ten bits of DPD data) is output from the system (e.g., via a transmitter to a requester of the conversion, or stored in storage accessible by the requester such as a register). The DPD data is also output to a parity generator 1206 that determines the parity of the DPD data and outputs a parity bit (also referred to herein as a first DPD parity bit) to a two input XOR gate 1208.

Figure 13:
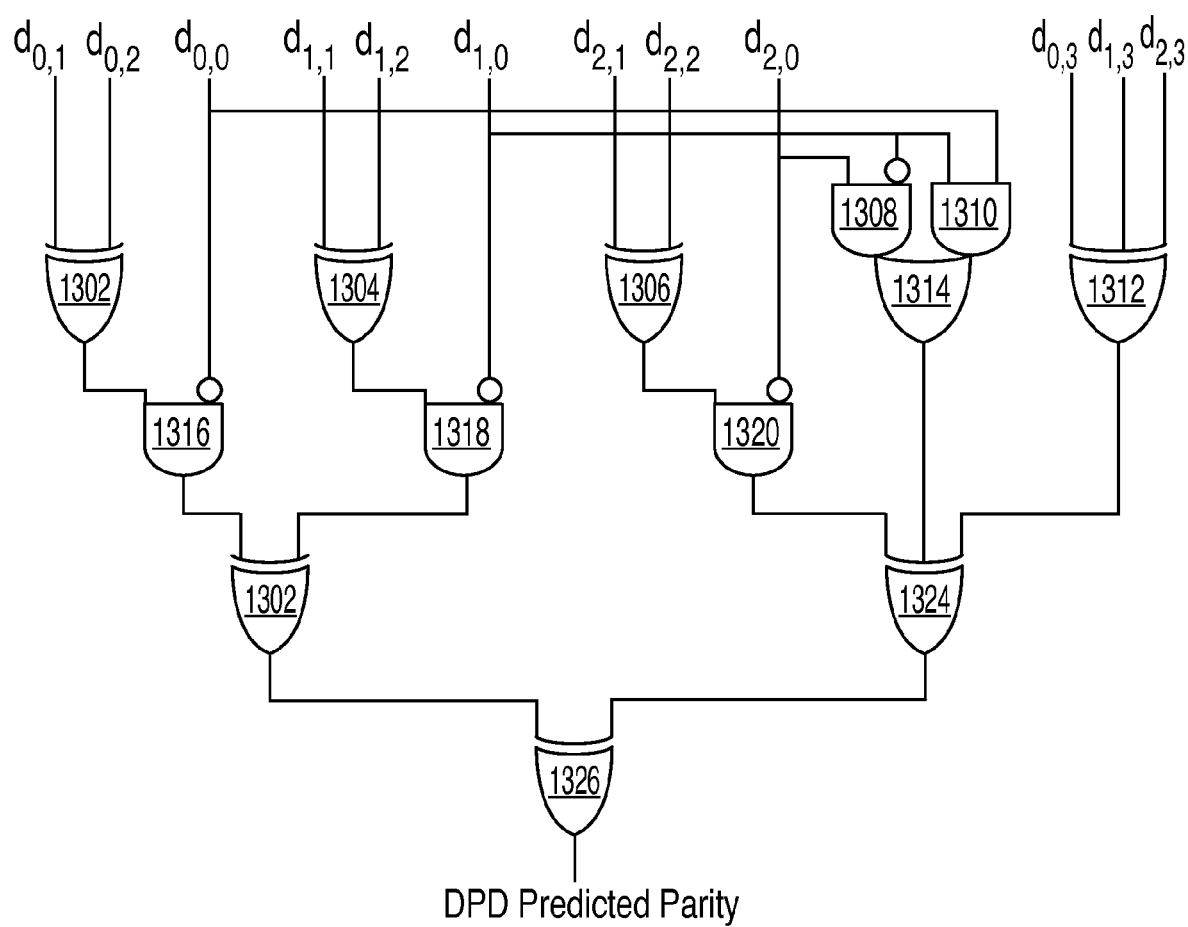
FIG. 13 depicts a BCD to DPD parity predictor that may be implemented by an exemplary embodiment.

The received BCD data is also input to a DPD parity predictor 1202. The DPD parity predictor 1202 generates a DPD parity bit (also referred to herein as a second DPD parity bit) based on the received BCD data. FIG. 13 below depicts a DPD parity predictor 1202 that may be implemented by an exemplary embodiment.

Referring to FIG. 12, the second DPD parity bit is output from the DPD parity predictor 1202 and stored in a latch such as a one bit register 1204. The second DPD parity bit is input to the two input XOR gate 1208 along with the first DPD parity bit to determine if they match. Output from the XOR gate 1208 is stored in a latch, such as a one bit error register 1210. Contents of the latch are referred to herein as an error flag. In an exemplary embodiment, if the parity bits don't match, the error flag is set (e.g., a value of one is written to the error register 1210) and if the parity bits match, the error flag is reset (e.g., a value on zero is written to the error register 1210). In another exemplary embodiment, the error flag is initialized to the value zero (e.g., is reset) and the error flag is set when the first DPD parity bit does not match the second DPD parity bit.

The error flag is output from the system (e.g., via a transmitter to a requestor of the conversion, or stored in storage accessible by the requestor such as a register) along with the DPD data. In an alternate exemplary embodiment, the first DPD parity bit is also output from the system along with the DPD data. In a further exemplary embodiment, the error flag is output from the system only when the error flag is set (indicating that an error had been detected in the DPD data).

FIG. 13 depicts a DPD parity predictor that may be implemented by an exemplary embodiment. The 12-bit BCD data d0,0:3 d1,0:3 and d2,0:3 are input to the BCD to DPD predictor. Input bits d0,1 and d0,2 are sent to a 2 input XOR gate 1302. Input bits d1,1 and d1,2 are sent to a two 2input XOR gate 1304. Input bits d2,1 and d2,2 are sent to a two input XOR gate 1306. Input bits d2,0 and the compliment of d1,0 are sent to two input AND gate 1308. Input bits d1,0 and d0,0 are sent to two input AND gate 1310. Inputs d0,3, d1,3 and d2,3 are sent to a three input XOR gate 1312. The output of AND gate 1308 and 1310 are sent to a two input OR gate 1314. The output of XOR gate 1302 and the compliment of input d0,0 are sent to a two input AND gate 1316. The output and XOR gate 1304 and the compliment of input d1,0 are sent to a two input AND gate 1318. The output of XOR gate 1306 and the compliment of input d2,0 are sent to a two input AND gate 1320. The output of AND gates 1316 and 1318 are sent to a two input XOR gate 1322. The output of AND gate 1320, OR gate 1314 and XOR gate 1312 are sent to a three input XOR gate 1324. The outputs of XOR gates 1322 and 1324 are sent to a two input XOR gate 1326. The output of XOR gate 1326 is the output of the BCD to DPD parity predictor and makes up the signal previously referred to as the second parity bit in FIG. 12.

The parity predictor effectively computes the parity of bit 3 for each of the digits d0, d1, and d2. That parity is combined with the parity of bits 1:2 of each of the three digits only if the value of the given digit is in the rage 0:7 as indicated by the most significant bit of that digit (bit 0). A third term formed by AND gates 1308 and 1310 and OR gate 1314 conditionally inverts the parity if both d0 and d1 have values 8:9 or if both d2 has a value of 8:9 and d1 has a value of 0:7.

Figure 14:
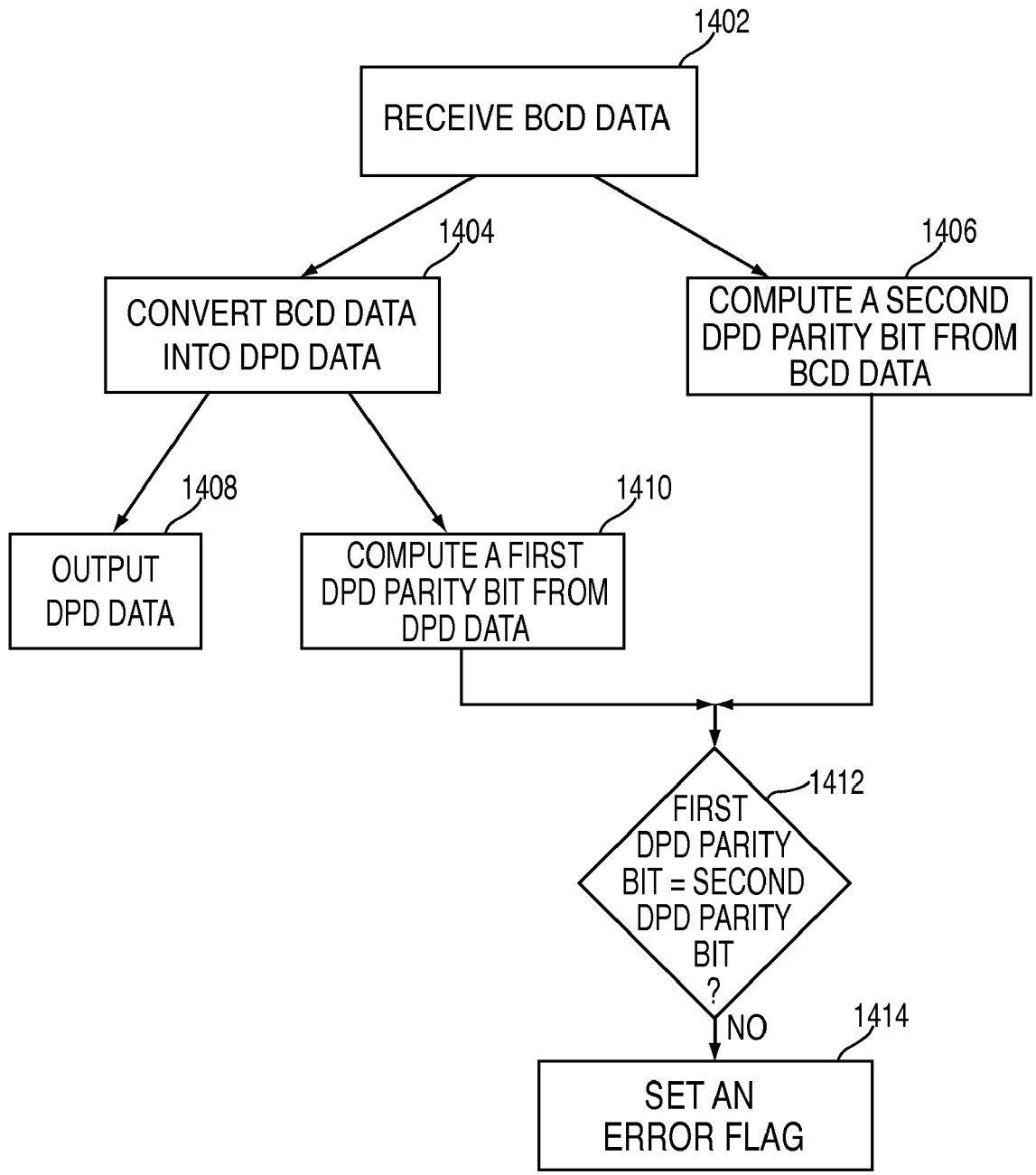
FIG. 14 depicts a process for performing error detection when converting from BCD data to BCD data that may be implemented by an exemplary embodiment.

FIG. 14 depicts a process for performing error detection when converting from BCD data to DPD data that may be implemented by an exemplary embodiment. The process depicted in FIG. 14 may be implemented by the systems depicted in FIGS. 9 and 12 described previously. At block 1402, BCD data is received from a BCD to DPD compression requester. As described previously, with respect to FIG. 9, a parity bit may also be received by the system. Processing then continues at blocks 1404 and 1406. At block 1404, the BCD data is converted into DPD data by a BCD to DPD converter 802. The converted DPD data is output to the requester and it is output to a parity generator, such as parity generator 906 or 1206. At block 1410, the parity generator computes a first DPD parity bit from the DPD data. Processing then continues at block 1412.

At block 1406, a second parity bit is computed by a parity bit mechanism based on the received BCD data. The parity bit mechanism may be implemented by a DPD parity predictor, such as DPD parity predictor 1202, or if a BCD input parity bit is also received from the requester it may be implemented by a DPD parity compensator, such as DPD parity compensator 902. Processing then continues at block 1412, where it is determined if the first DPD parity bit is equal to the second DPD parity bit (e.g., using XOR gate 908 or 1208). If they are not equal, block 1214 is performed and an error flag is set. In an exemplary embodiment, the error flag (e.g., located in register 910 or 1210) is sent to the requester along with the DPD data.

In an alternate exemplary embodiment, the size of the received DPD data is larger than ten bits (e.g., a multiple of ten bits). The size of the resulting BCD data varies depending on the size of the received DPD data. Similarly, in an alternate exemplary embodiment, the size of the received BCD data is larger than twelve bits (e.g., a multiple of twelve bits). The size of the resulting DPD data varies depending on the size of the received BCD data.

Any BCD to DPD converter known in the art may be utilized by an exemplary embodiment. Similarly, any DPD to BCD converter known in the art may be utilized by an exemplary embodiment.

Technical effects and benefits include eliminating the need for duplicate converters, multi-bit comparators, and parity detectors by compensating (or predicting) group parity on the inbound DPD data so it matches the parity on the data after it is converted. Likewise, the parity on the outbound BCD data can be compensated (or predicted) with a separate circuit such that it will match the group parity on the DPD data resulting from the BCD to DPD data converter. This significantly reduces the area and power needed to provide error detection for DPD to BCD expansion and BCD to DPD compression.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer-usable or computer-readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/ or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 15:
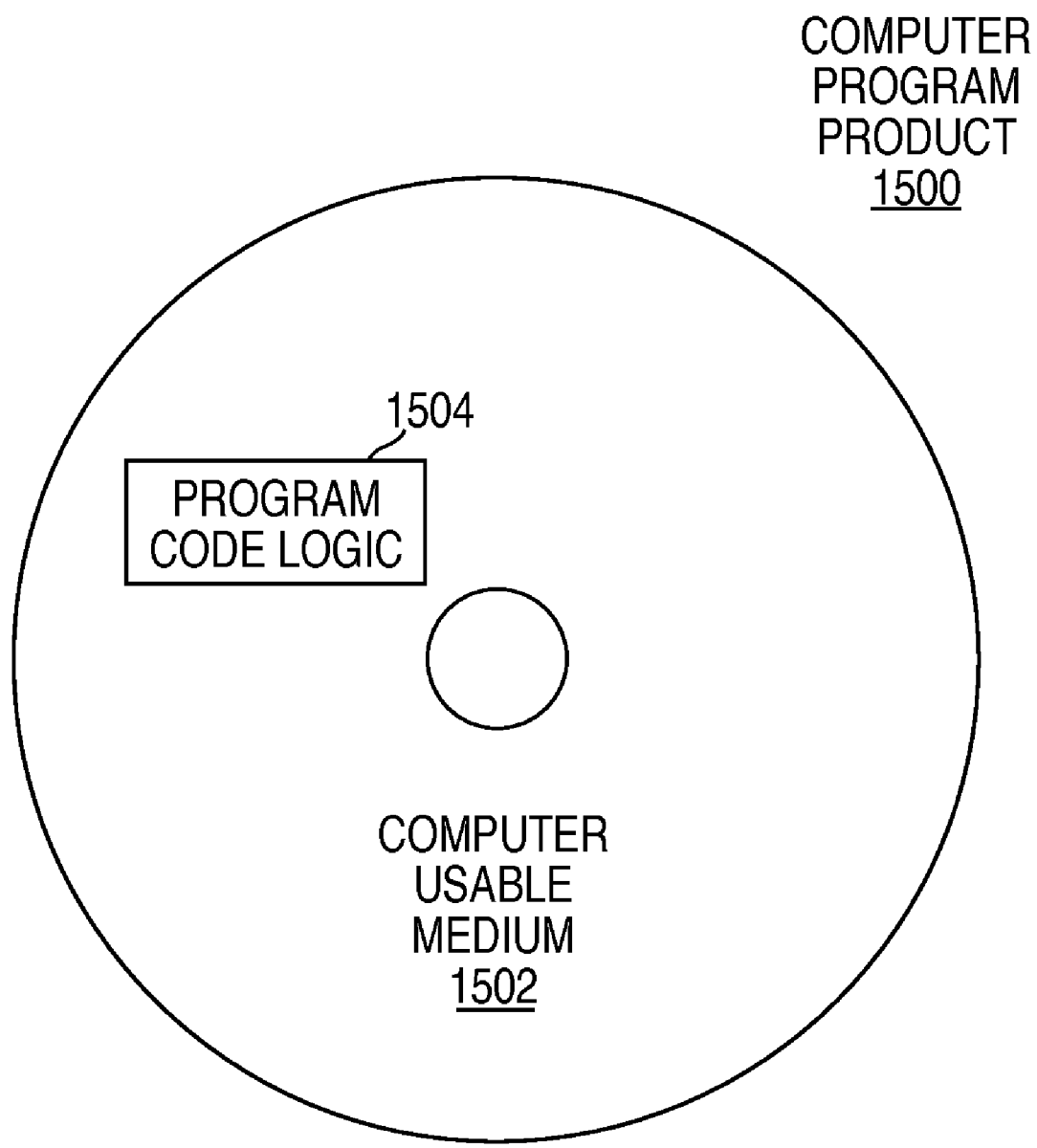
FIG. 15 depicts a computer program product that may be implemented by an exemplary embodiment of the invention.

As described above, embodiments can be embodied in the form of computer-implemented processes and apparatuses for practicing those processes. In exemplary embodiments, the invention is embodied in computer program code executed by one or more network elements. Embodiments include a computer program product 1500 as depicted in FIG. 15 on a computer usable medium 1502 with computer program code logic 1504 containing instructions embodied in tangible media as an article of manufacture. Exemplary articles of manufacture for computer usable medium 1502 may include floppy diskettes, CD-ROMs, hard drives, universal serial bus (USB) flash drives, or any other computer-readable storage medium, wherein, when the computer program code logic 1504 is loaded into and executed by a computer, the computer becomes an apparatus for practicing the invention. Embodiments include computer program code logic 1504, for example, whether stored in a storage medium, loaded into and/or executed by a computer, or transmitted over some transmission medium, such as over electrical wiring or cabling, through fiber optics, or via electromagnetic radiation, wherein, when the computer program code logic 1504 is loaded into and executed by a computer, the computer becomes an apparatus for practicing the invention. When implemented on a general-purpose microprocessor, the computer program code logic 1504 segments configure the microprocessor to create specific logic circuits.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention claimed is:

1. A computer program product for performing error detection, the computer program product comprising:
    a tangible non-transitory storage medium readable by a processing circuit and storing instructions for execution by the processing circuit for performing a method comprising:
    receiving formatted decimal data in a first format, the formatted decimal data consisting of any one of a densely packed decimal (DPD) format data or a binary coded decimal (BCD) format data;
    generating one or more first parity bits, the generating comprising converting the received data into a second format of the formatted decimal data, the second format being a format other than the first format, and determining parity of the data in the second format;
    generating one or more second parity bits directly from the received data in the first format;
    comparing the first parity bits to the second parity bits; and
    setting an error flag to indicate an error in the data in the second format in response to the first parity bits not being equal to the second parity bits.

2. The computer program product of claim 1, wherein the generating the second parity bits includes predicting a parity of the data in the second format.

3. The computer program product of claim 1, further comprising receiving one or more parity bits for the received data in the first format, wherein the generating the second parity bits is further responsive to the received parity bits.

4. The computer program product of claim 3, wherein the generating the second parity bits includes modifying the received parity bits such that in the absence of an error they will match the parity of the data in the second format.

5. The computer program product of claim 1, wherein the received data includes multiples of ten bits when the first format is DPD and multiples of twelve bits when the first format is BCD.

6. The computer program product of claim 1, further comprising outputting the error flag.

7. The computer program product of claim 1, further comprising outputting the data in the second format.

8. The computer program product of claim 1, wherein the second format is BCD when the first format is DPD and the second format is DPD when the first format is BCD.

9. A system for performing error detection, the system comprising:
    a converter receiving formatted decimal data in a first format, and converting the received data into a second format, the formatted decimal data consisting of any one of a densely packed decimal (DPD) format data or a binary coded decimal (BCD) format data, and the second format being a format other than the first format;
    a parity generator connected to the converter, the parity generator receiving the data in the second format, and generating one or more first parity bits by determining the parity of the data in the second format;
    a parity bit mechanism receiving the data in the first format and generating one or more second parity bits directly from the data in the first format; and
    a comparator connected to the parity bit generator and the parity bit mechanism, the comparator comparing the first parity bits and the second parity bits, and setting an error flag to indicate an error in the data in the second format in response to the first parity bits not being equal to the second parity bits.

10. The system of claim 9, wherein the parity bit mechanism includes a parity predictor.

11. The system of claim 9, wherein the parity bit mechanism further receives one or more parity bits for the data in the first format and the generating the second parity bits is further responsive to the received parity bits.

12. The system of claim 11, wherein the parity bit mechanism includes a parity compensator modifying the received parity bits such that in the absence of an error they will match the parity of the data in the second format.

13. The system of claim 9, wherein the converter outputs the data in the second format.

14. The system of claim 9, wherein the comparator outputs the error flag.

15. A method for performing error detection, the method comprising:
receiving formatted decimal data in a first format, the formatted decimal data consisting of any one of a densely packed decimal (DPD) format data or a binary coded decimal (BCD) format data;
generating one or more first parity bits, the generating comprising converting the received data into a second format of the formatted decimal data, the second format being a format other than the first format, and determining parity of the data in the second format;
generating one or more second parity bits directly from the received data in the first format;
comparing the first parity bits to the second parity bits; and
setting an error flag to indicate an error in the data in the second format in response to the first parity bits not being equal to the second parity bits.

16. The method of claim 15, wherein the generating the second parity bits includes predicting a parity of the data in the second format.

17. The method of claim 15, further comprising receiving one or more parity bits for the received data in the first format, wherein the generating the second parity bits is further responsive to the received parity bits.

18. The method of claim 17, wherein the generating the second parity bits includes modifying the received parity bits such that in the absence of an error they will match the parity of the data in the second format.

19. The method of claim 15, wherein the received data includes multiples of ten bits when the first format is DPD and multiples of twelve bits when the first format is BCD.

20. The method of claim 15, further comprising outputting one or both of the error flag and the data in the second format.

* * * * *